United States Patent

Kim et al.

[11] Patent Number: 5,947,134
[45] Date of Patent: Sep. 7, 1999

[54] SCRUBBING EQUIPMENT FOR A SEMICONDUCTOR DEVICE USING LASER DISTANCE SENSOR TO AUTOMATICALLY ADJUST BRUSH HEIGHT ABOVE THE WAFER

[75] Inventors: Ki-ho Kim, Yongin; Hong-bae Moon, Seoul, both of Rep. of Korea

[73] Assignee: Samsung Electronics Co., Ltd., Suwon, Rep. of Korea

[21] Appl. No.: 08/929,170

[22] Filed: Sep. 15, 1997

[30] Foreign Application Priority Data

Sep. 23, 1996 [KR] Rep. of Korea ................ 96-41752

[51] Int. Cl.⁶ ................................................ B08B 3/02
[52] U.S. Cl. ................ 134/57 R; 134/153; 134/902; 15/77; 15/88.2; 15/88.3
[58] Field of Search ................ 15/77, 88.3, 88.2; 134/57 R, 153, 902

[56] References Cited

U.S. PATENT DOCUMENTS

| 5,475,889 | 12/1995 | Thrasher et al. | 15/77 |
| 5,636,401 | 6/1997 | Yonemizu et al. | 15/97.1 |
| 5,647,083 | 7/1997 | Sugimoto et al. | 15/88.2 |
| 5,829,087 | 11/1998 | Nishimura et al. | 15/77 |

FOREIGN PATENT DOCUMENTS

| 61-16528 | 1/1986 | Japan | 134/902 |

*Primary Examiner*—Mark Spisich
*Assistant Examiner*—Theresa T. Snider
*Attorney, Agent, or Firm*—Jones & Volentine, L.L.P.

[57] ABSTRACT

Scrubbing equipment for semiconductor devices includes an automatic brush-height adjustment device for automatically adjusting the height of a brush over a wafer surface so that eddy currents are produced in a layer of water on the wafer and minute particles are cleaned from the wafer without damaging the wafer surface. The brush-height adjustment device uses a distance sensor which measures the distance between the tip of the brush and the top of the wafer using laser pulses and then controls up-and-down movement of the shaft upon which the brush is mounted based upon that distance.

9 Claims, 2 Drawing Sheets

SCRUBBING EQUIPMENT FOR A SEMICONDUCTOR DEVICE USING LASER DISTANCE SENSOR TO AUTOMATICALLY ADJUST BRUSH HEIGHT ABOVE THE WAFER

BACKGROUND OF THE INVENTION

1. Field of the Invention

The present invention relates to scrubbing equipment used for a semiconductor device, and more particularly, to an automatic brush-height adjusting device for scrubbing equipment for cleaning a semiconductor wafer using a brush, in which the distance between the brush and the wafer surface is automatically adjusted using a laser.

2. Background of the Related Art

Production of semiconductor devices having microscopic structures requires high-precision technology. During processing, minute particles of dust on the circuits which constitute a semiconductor device may degrade the reliability of the finished semiconductor device. Even if dust contaminants produced during processing, which end up on a semiconductor wafer, do not adversely affect the circuit functions of the semiconductor device, they still may lead to fabrication difficulties. Therefore, the semiconductor device should be fabricated in a dirt-free environment, and the surface of the semiconductor wafer should be washed to remove minute particles of dust generated during processing.

The cleaning steps are carried out by sprinkling pure water on the wafer surface, or by allowing a rotary-fiber brush steeped in a cleansing agent or pure water to contact the surface of the wafer. Scrubbing equipment is used to clean the surface of the wafer by removing dust contaminants with a brush and pure water.

Recently available multilayer and high integration semiconductor devices are easily damaged. When the rotary fiber brush of the conventional scrubbing equipment contacts a wafer surface, films or patterns formed on the semiconductor wafer can be damaged. To prevent this problem, scrubbing equipment is used whose brush does not directly contact the wafer surface during the cleaning step.

When pure water is continuously sprinkled over the wafer surface, the surface of the wafer becomes covered with the pure water. At this point, the depth of the pure water on the wafer surface is about 1 mm to 2 mm. Then the brush is moved into the pure water, but not in contact with the wafer surface. A rotary chuck supporting the wafer begins to rotate, and the brush creates eddy currents in the pure water so that the minute particles are removed from the semiconductor wafer by the eddy currents.

Referring to FIG. 1, a conventional scrubbing equipment includes a rotary chuck 11 on which a semiconductor wafer 10 is placed, a brush arm 12 extending from shaft 13 at a right angle and fixed to the shaft 13 such that brush arm 12 can move up and down and rotate, and a brush 14 made of TEFLON and provided on one end of the brush arm 12. The brush 14 is housed in a slick cover to conceal the fibers forming the brush 14. In the cleaning step, an operator uses the naked eye to adjust the distance between the brush 14 and a wafer to be cleaned, based on the position of the tip of the brush cover.

When the scrubbing equipment is not in use, the brush 14 is placed in a pure water container 15 in order to prevent the brush 14 from drying out. A pure water nozzle 16 for pure water supply is provided over the rotary chuck 11. These components are controlled by a micro-controller 17.

Referring to FIG. 2, the operation of the scrubbing equipment will be described as follows.

When the scrubbing equipment starts to operate, a semiconductor wafer 10 is placed on the rotary chuck 11 and the rotary chuck 11 starts to rotate. Pure water is sprinkled over the rotating wafer 10. The shaft 13 supporting the brush arm 12 moves up and rotates so that the brush arm 12 also moves up and turns around the shaft 13. Then the brush arm 12 and brush 14 move down until the brush 14 is in contact with the pure water on the wafer 10. As the shaft 13 rotates, the brush arm 12 moves slowly in the direction of the arrow "b" in such a manner that the brush 14 moves parallel to the surface of the wafer until the brush reaches the center of the wafer.

As the wafer 10, which is fixedly mounted on the rotary chuck 11, rotates at high speed in the direction of the arrow "a", eddy currents are created by the brush 14 in the water on the wafer surface in the direction of the arrow "c", thereby performing the cleaning step for the removal of dust contaminants.

The pressure created by the brush is not important to the above-described scrubbing equipment. What is important is to maintain the appropriate distance between the wafer and the brush. In other words, if the brush is too far from the wafer and does not contact the pure water, or if the brush contacting the pure water generates weak eddy currents on the surface of the wafer, the cleaning efficiency is reduced. On the contrary, if the brush is too close to the wafer, the brush will scratch the wafer.

In the conventional scrubbing equipment, since the distance between the brush and a semiconductor wafer to be cleaned is adjusted with the naked eye on the basis of the position of the tip of the brush cover, when a worn-out brush is replaced by a new one, the height at which the brush is set must be readjusted by the operator.

When the conventional scrubbing equipment performs cleaning on various wafers of different film thickness, the distance between the brush and wafer should be readjusted for each film thickness. Therefore, the conventional scrubbing equipment may damage the semiconductor wafer being cleaned and cannot ensure the effectiveness of cleaning, and time is wasted during each readjustment.

SUMMARY OF THE INVENTION

Accordingly, the present invention is directed to scrubbing equipment for semiconductor devices having a laser distance sensor that provides for the automatic adjustment of the distance between the brush and a wafer to be cleaned, in order to perform cleaning of any semiconductor wafer under optimum conditions.

The scrubbing equipment of the present invention comprises: a rotary chuck which accommodates a semiconductor wafer to be cleaned; water supply means furnishing pure water to the wafer for cleaning; a brush interacting with the pure water to create eddy currents; a brush arm and a shaft supporting and moving the brush; a controller operating each part; and an automatic brush-height adjustment device for measuring a distance between the tip of the brush and the top of the wafer, and for controlling the up-and-down movement of the shaft through the controller.

In the operation of the scrubbing equipment, the controller sends a source signal into a processor. According to the source signal, the processor actuates the distance measuring device and stores a value found by the distance measuring device. The processor compares the value with a standard value preset therein, and sends a signal output thereby into the controller. On receiving this signal, the controller applies power to a motor for operating the shaft so as to adjust the height of the shaft to which the brush arm is fixed.

If the controller of the scrubbing equipment can process the output signal of the distance measuring device according to a predetermined program, the controller becomes a part of the automatic brush-height adjustment device and may be directly connected to the distance measuring device without a secondary processor.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings illustrate an embodiment of the invention, in which:

FIG. 1 schematically depicts a conventional scrubbing equipment for a semiconductor device;

FIG. 2 shows the cleaning operation of a brush of the scrubbing equipment as shown in FIG. 1 moving on a semiconductor wafer rotating on the scrubbing equipment;

FIG. 3 schematically depicts a scrubbing equipment for a semiconductor device in accordance with a preferred embodiment of the present invention; and FIG. 4 illustrates a brush-height adjustment device for the brush of the scrubbing equipment as shown in FIG. 3.

DETAILED DESCRIPTION OF PREFERRED EMBODIMENT

Reference will now be made in detail to the preferred embodiment of the present invention, an example of which is illustrated in the accompanying drawings.

Figure 1:
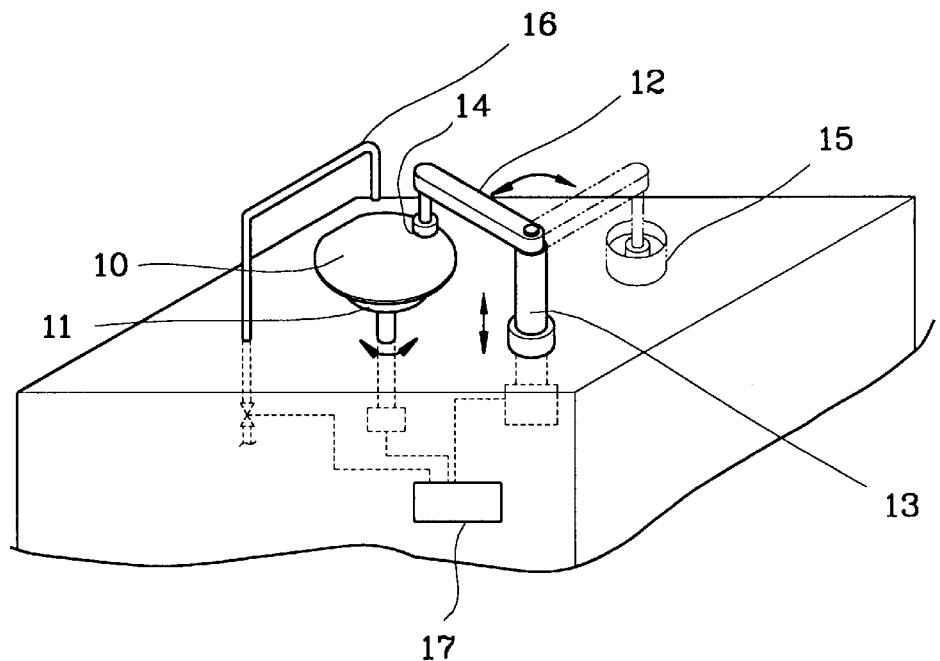
Figure 2:
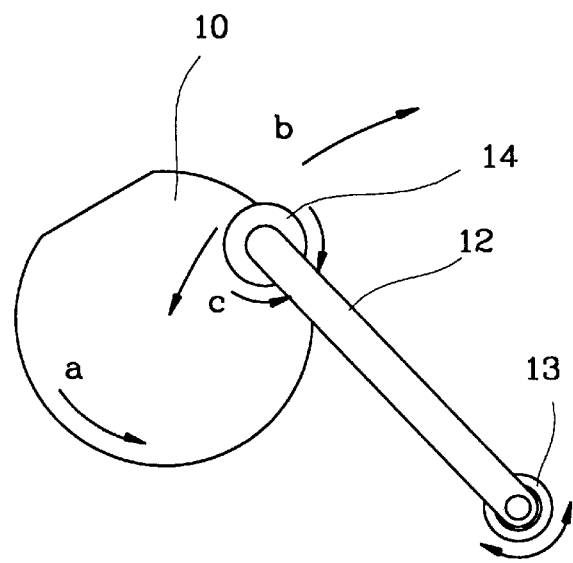
Figure 3:
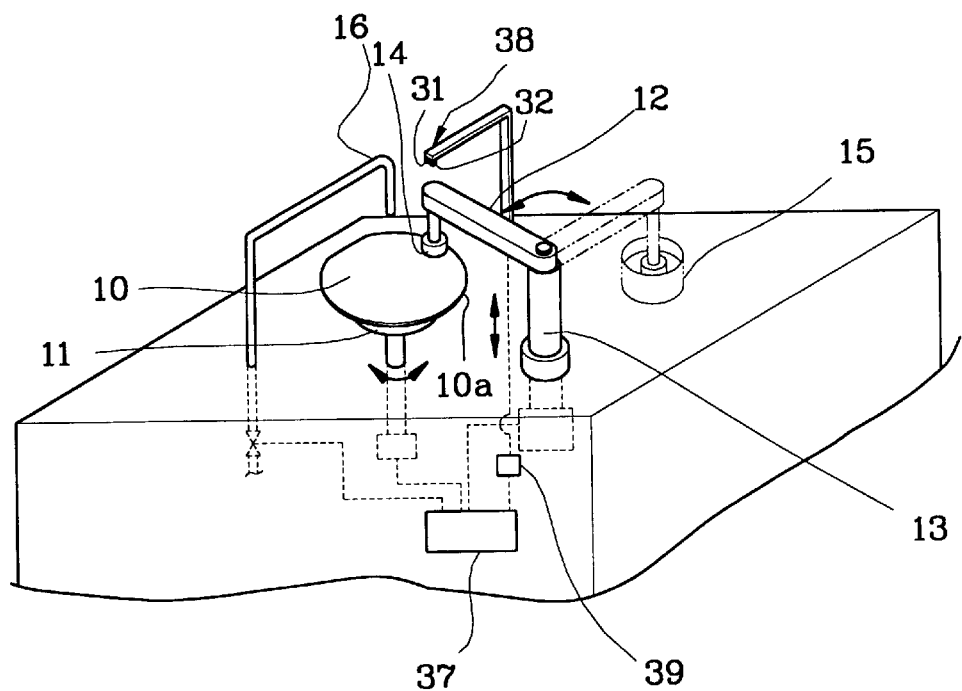
Figure 4:
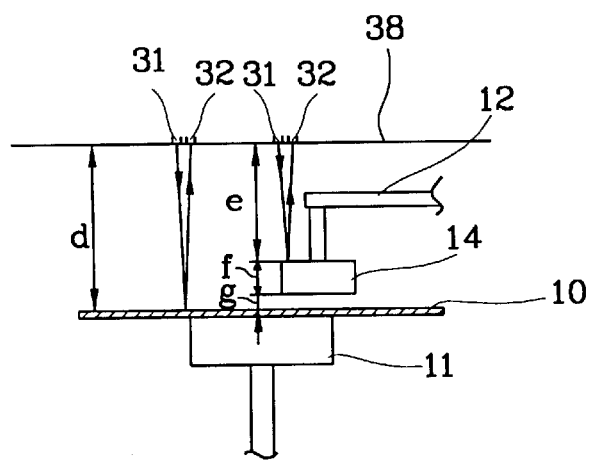

Referring to FIGS. 3 and 4, a scrubbing equipment of the present invention includes a rotary chuck 11, a pure water nozzle 16 formed over the rotary chuck 11, a brush arm 12 and a shaft 13 adjacent to the rotary chuck 11, and a brush 14 provided on one end of the brush arm 12. An automatic brush-height adjustment device is located near the pure water nozzle 16, the brush-height adjustment device comprising a distance sensor 38 using laser pulses which is installed so as to hang over the outer edge 10a of a wafer 10 that is placed on the rotary chuck 11.

When the wafer 10 is placed on the rotary chuck 11, a light-emitting portion 31 of the distance sensor 38 casts the laser pulse upon the top of the wafer 10 in response to a signal output through a controller 37 and a processor 39. A light-receiving portion 32 senses the reflected light of the laser pulse and sends a light-reception signal into the processor 39. The processor 39 may be integral with the controller 37.

The processor 39 measures the position of the wafer, i.e., the distance "d" from the distance sensor 38 to the top of the wafer, by using the above signals and its own clock signal. In order to find the distance "d", first the distance of reciprocation is calculated by multiplying the speed of light by the time required from the irradiation of the laser pulse from the light-emitting portion 31 to the detection of the reflected laser pulse by the light-receiving portion 32. The distance "d" is then calculated by dividing the value of the distance of reciprocation by 2.

Pure water is then furnished to the wafer, the brush 14 is raised out of pure water container 15 to a predetermined height, and the shaft 13 rotates to allow the brush 14 to pass under the distance sensor 38 and into place above the top of the wafer 10. Then, the laser pulse is cast upon the brush 14 with a predetermined frequency, and the distance "e" from the distance sensor 38 to the upper portion of the brush 14 is measured in the same manner as that of distance "d".

Through the processor 39, the thickness "f" of the brush 14 is added to the distance "e", and the distance "d" is subtracted from the output of this addition to thereby find a negative value. This negative value is indicative of the distance "g" between the wafer 10 and the brush 14, i.e., the distance "g" is the distance between the bottom of the brush 14 and the top of the wafer 10. When the absolute value of the subtraction calculation is either smaller than or the same as a standard value of the distance between the brush and the wafer preset in the processor 39, the laser pulse produced by the light-emitting portion 31 of the distance sensor 38 is shut off.

The output signal of the processor 39 is sent into the controller 37 to thereby stop the shaft 13 from moving downward. With the rotation of shaft 13, the brush arm 12 is slowly moved to the center of the wafer 10 onto which the pure water flows. Since the brush 14 is fixed to the end of the brush arm 12 and moves horizontally with the rotation of the shaft 13, the brush 14 contacts the pure water while maintaining the proper spacing from the top of the wafer 10 so as to create eddy currents.

The time elapsed during casting of each laser pulse upon the wafer should be shorter than the frequency of irradiation of the laser pulse in order to prevent confusion. The frequency of irradiation of the laser pulse should be short so that the brush moves a very short distance during the frequency period. Preferably, a high precision motor with excellent braking ability is used to raise or lower the shaft.

According to the above-described method, once the brush is placed directly under the distance sensor 38, the position of the brush is measured, and the distance between the top of the wafer and the brush is calculated. A predetermined magnitude of electricity is furnished to the motor used to operate the shaft, according to the output value of the calculation. In other words, the predetermined magnitude of electricity allows the shaft to move so that the brush is moved to an appropriate location over the wafer for cleaning the wafer.

According to this inventive scrubbing equipment for a semiconductor device, the height of the brush can be adjusted with respect to every wafer put on the rotary chuck. Since semiconductor wafers of the same lot are in the same condition, the height of the brush is adjusted with respect to a first wafer of the lot, and the height of the brush which is set for the first wafer can be applied to the rest of the same lot, thereby reducing processing time.

In order to prevent the brush from being lowered to below the top of the wafer, a minimum value for the height of the brush is preset in the processor to prevent damage to the wafer to be cleaned. The processor either controls the brush so that it is not lowered below the minimum value, or prevents the brush from being lowered below the top of the wafer by controlling the height of the shaft. According to the present invention, the distance between the wafer and the brush can be adjusted to a standard level automatically. Therefore, during processing, the present invention permits the cleaning step to be performed under optimum conditions with respect to various types of wafers.

It will be apparent to those skilled in the art that various modifications and variations can be made in the scrubbing equipment of the present invention without departing from the spirit or scope of the invention. Thus, it is intended that the present invention cover the modifications and variations of this invention provided they come within the scope of the appended claims and their equivalents.

What is claimed is:

1. A scrubbing equipment for semiconductor devices, comprising:
   a rotary chuck which accommodates a semiconductor wafer to be cleaned;
   water supply means for furnishing pure water to the surface of the semiconductor wafer for cleaning;
   a brush capable of interacting with the pure water on the surface of the semiconductor wafer to create eddy currents;
   a brush arm and a shaft capable of supporting and moving the brush;
   a controller for operating said scrubbing equipment; and
   an automatic brush-height adjustment device for measuring a distance between a tip of the brush and a top of the wafer, and for controlling up-and-down movement of the shaft through said controller to ensure that the tip of the brush does not directly contact the top of the wafer.

2. The scrubbing equipment for semiconductor devices according to claim 1, said automatic brush-height adjustment device further comprising a distance sensor and a processor for sending an electrical signal to said controller for controlling the up-and-down movement of said shaft.

3. The scrubbing equipment for semiconductor devices according to claim 2, wherein said processor is integral with said controller.

4. The scrubbing equipment for semiconductor devices according to claim 2, wherein said distance sensor is located so as to hang over an outer edge of the semiconductor wafer placed on said rotary chuck, said distance sensor further comprising a light-emitting side capable of casting a laser pulse upon the semiconductor wafer in response to an operating signal, and a light-receiving side capable of receiving a reflected light of the laser pulse.

5. The scrubbing equipment for semiconductor devices according to claim 3, wherein said distance sensor is located so as to hang over an outer edge of the semiconductor wafer placed on said rotary chuck, said distance sensor further comprising a light-emitting side capable of casting a laser pulse upon the semiconductor wafer in response to an operating signal, and a light-receiving side capable of receiving a reflected light of the laser pulse.

6. The scrubbing equipment for semiconductor devices according to claim 4, wherein said laser pulse is a predetermined frequency.

7. The scrubbing equipment for semiconductor devices according to claim 5, wherein said laser pulse is a predetermined frequency.

8. The scrubbing equipment for semiconductor devices according to claim 4, wherein said automatic brush-height adjustment device, said processor and said controller function to adjust brush height based upon said distance between the tip of the brush and the top of the wafer, said distance being calculated by subtracting a measured distance from the distance sensor to the top of the wafer from a total of a known brush thickness plus a measured distance from the distance sensor to a top of the brush.

9. The scrubbing equipment for semiconductor devices according to claim 5, wherein said automatic brush-height adjustment device, said processor and said controller function to adjust brush height based upon said distance between the tip of the brush and the top of the wafer, said distance being calculated by subtracting a measured distance from the distance sensor to the top of the wafer from a total of a known brush thickness plus a measured distance from the distance sensor to a top of the brush.

* * * * *